US010297293B2

(12) United States Patent
Lee

(10) Patent No.: US 10,297,293 B2
(45) Date of Patent: May 21, 2019

(54) SEMICONDUCTOR APPARATUS AND METHOD OF OPERATING THE SAME

(71) Applicant: SK hynix Inc., Icheon-si, Gyeonggi-do (KR)

(72) Inventor: Yo Sep Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/458,527

(22) Filed: Mar. 14, 2017

(65) Prior Publication Data

US 2018/0033466 A1 Feb. 1, 2018

(30) Foreign Application Priority Data

Jul. 29, 2016 (KR) ........................ 10-2016-0097211

(51) Int. Cl.

*G11C 7/10* (2006.01)
*G06F 1/12* (2006.01)
*G06F 3/06* (2006.01)
*G11C 8/10* (2006.01)
*G11C 8/12* (2006.01)
*G11C 8/18* (2006.01)

(52) U.S. Cl.

CPC .................. *G11C 7/10* (2013.01); *G06F 1/12* (2013.01); *G06F 3/0604* (2013.01); *G06F 3/0659* (2013.01); *G06F 3/0679* (2013.01); *G11C 7/109* (2013.01); *G11C 8/10* (2013.01); *G11C 8/12* (2013.01); *G11C 8/18* (2013.01)

(58) Field of Classification Search

CPC . G11C 7/10; G06F 1/12; G06F 3/0604; G06F 3/0659; G06F 3/0679
USPC ........................... 365/189.011–225.7, 189.05
See application file for complete search history.

(56) References Cited

U.S. PATENT DOCUMENTS 4,707,809 A * 11/1987 Ando ........................ G11C 8/18
365/189.05

FOREIGN PATENT DOCUMENTS

KR 1020090034570 A 4/2009

* cited by examiner

*Primary Examiner* — Harry W Byrne
(74) *Attorney, Agent, or Firm* — William Park & Associates Ltd.

(57) ABSTRACT

A semiconductor apparatus includes a decoder configured to decode an internal command, and generate a first decoding command and a second decoding command. The semiconductor apparatus may include an output timing control circuit configured to delay the second decoding command by a predetermined cycle of the internal clock, and output a delayed decoding command. The semiconductor apparatus may include an input/output control latch circuit configured to output the internal address as a first latch address based on the second decoding command and the delayed decoding command. The semiconductor apparatus may include an input control latch circuit configured to output the internal address as a second latch address based on the first decoding command.

7 Claims, 4 Drawing Sheets

SEMICONDUCTOR APPARATUS AND METHOD OF OPERATING THE SAME

CROSS-REFERENCES TO RELATED APPLICATION

The present application claims priority under 35 U.S.C. § 119(a) to Korean application number 10-2016-0097211, filed on Jul. 29, 2016, in the Korean Intellectual Property Office, which is incorporated herein by reference in its entirety.

BACKGROUND

1. Technical Field

Various embodiments may generally relate to a system and semiconductor integrated circuit, and, more particularly, to a semiconductor apparatus.

2. Related Art

A semiconductor apparatus is configured to operate in synchronization with a clock signal. For example, a semiconductor apparatus is configured to receive control signals for controlling the semiconductor apparatus, in synchronization with a clock signal, operate by the control signals synchronized with the clock signal and output a signal synchronized with the clock signal.

Signals for controlling a semiconductor apparatus include control signals such as a command and an address. The semiconductor apparatus is configured to operate by the command and address signals synchronized with a clock signal.

SUMMARY

In an embodiment, a semiconductor apparatus may be provided. The semiconductor apparatus may include a decoder configured to decode an internal command, and generate a first decoding command and a second decoding command. The semiconductor apparatus may include an output timing control circuit configured to delay the second decoding command by a predetermined cycle of the internal clock, and output a delayed decoding command. The semiconductor apparatus may include an input/output control latch circuit configured to output the internal address as a first latch address based on the second decoding command and the delayed decoding command. The semiconductor apparatus may include an input control latch circuit configured to output the internal address as a second latch address based on the first decoding command.

In an embodiment, a semiconductor apparatus may be provided. The semiconductor apparatus may include a first semiconductor chip. The semiconductor apparatus may include a second semiconductor chip including a second latch group which operates based on signals inputted from the first semiconductor chip.

In an embodiment, a semiconductor apparatus may be provided. The semiconductor apparatus may include a first semiconductor chip and a second semiconductor chip electrically coupled with each other through a plurality of through electrodes, the first semiconductor chip may include a decoder which decodes an internal command and may generate a first decoding command and a second decoding command, an output timing control circuit which may delay the second decoding command by a predetermined cycle of an internal clock and may output a delayed decoding command, a first input/output control latch circuit which may output an internal address as a first latch address based on the second decoding command and the delayed decoding command, and a first input control latch circuit which may output the internal address as a second latch address based on the first decoding command, and the second semiconductor chip receiving the first decoding command, the second decoding command, the delayed decoding command and the internal address as a first decoding transfer command, a second decoding transfer command, a delayed decoding transfer command and an internal transfer address through a plurality of through electrodes, and including a second input/output control latch circuit which may output the internal transfer address as a third latch address based on the second decoding transfer command and the delayed decoding transfer command and a second input control latch circuit which outputs the internal transfer address as a fourth latch address based on the first decoding transfer command.

In an embodiment, a method of operating a semiconductor apparatus may be provided. The method may include receiving an external command. The method may include decoding the external command. The method may include outputting the external command by delaying the external command by a predetermined time or outputting the external command without delaying the external command by the predetermined time based on the decoding of the external command. The method may include an external address. The method may include outputting the external address with or without the predetermined time delay based on the decoding of the external command.

In an embodiment, a semiconductor apparatus may be provided. The semiconductor apparatus may include a decoder configured to decode an internal command, and generate a first decoding command or a second decoding command depending on the internal command. The semiconductor apparatus may include a latch group configured to receive an internal address, and output the internal address as a first latch address or second latch address based on the first decoding command or the second decoding command. The internal address may be delayed by a predetermined time and outputted as the first latch address if the second decoding command is generated. The internal address may be outputted as the second latch address if the first decoding command is generated.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Hereinafter, a semiconductor apparatus will be described below with reference to the accompanying drawings through various examples of embodiments.

Figure 1:
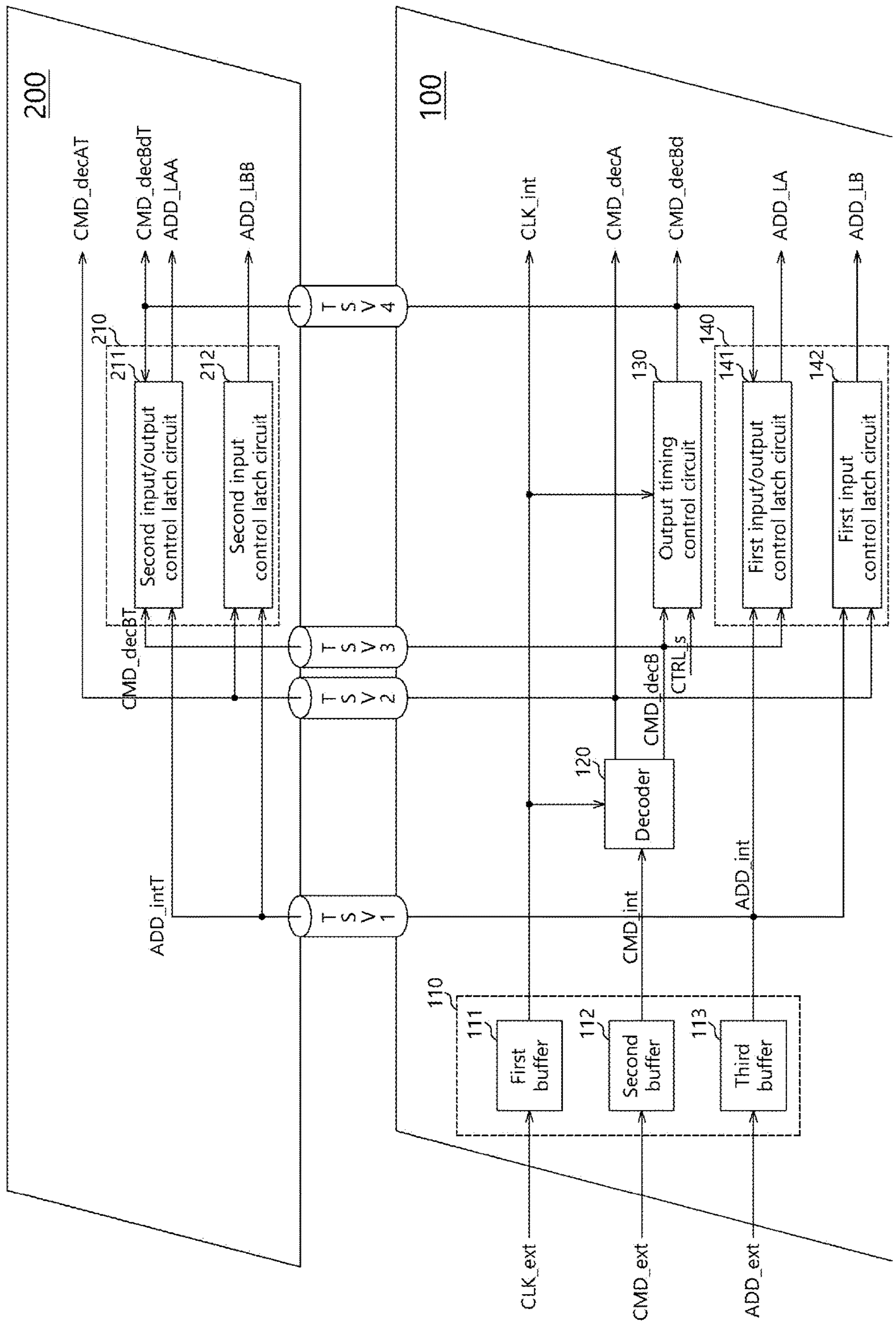
FIG. 1 is a configuration diagram illustrating a representation of an example of a semiconductor apparatus in accordance with an embodiment.

Referring to FIG. 1, a semiconductor apparatus in accordance with an embodiment may include a first semiconductor chip 100 and a second semiconductor chip 200.

The first semiconductor chip 100 may include a buffer group 110, a decoder 120, an output timing control circuit 130, and a first latch group 140.

The buffer group 110 may include a plurality of buffers which respectively buffer an external clock signal CLK_ext, an external command CMD_ext and an external address ADD_ext inputted from an exterior and generate respectively an internal clock signal CLK_int, an internal command CMD_int and an internal address ADD_int.

The buffer group 110 may include first to third buffers 111, 112 and 113.

The first buffer 111 may buffer the external clock signal CLK_ext and generate the internal clock signal CLK_int.

The second buffer 112 may buffer the external command CMD_ext and generate the internal command CMD_int. Each external command CMD_ext and internal command CMD_int may include a chip select signal, a row address strobe signal, a column address strobe signal, a write enable signal and a clock enable signal.

The third buffer 113 may buffer the external address ADD_ext and generate the internal address ADD_int. Each external address ADD_ext and internal address ADD_int may include at least one address.

The first to third buffers 111, 112 and 113 may change signals according to the voltage levels used outside the semiconductor apparatus, into signals according to the voltage levels used inside the semiconductor apparatus.

The decoder 120 may generate a first decoding command CMD_decA and a second decoding command CMD_decB in response to the internal command CMD_int and the internal clock signal CLK_int. For example, the decoder 120 may decode the internal command CMD_int in synchronization with the internal clock signal CLK_int, and generate the first and second decoding commands CMD_decA and CMD_decB as a decoding result. The first decoding command CMD_decA may represent a command which does not require output timing control, and the second decoding command CMD_decB may represent a command which requires output timing control. The output timing control may be latency control that is required in a read or write operation. In an embodiment, the control of the operation timing of a semiconductor apparatus may be required when the internal command is received for the purposes of performing a read or write operation.

The output timing control circuit 130 may generate a delayed decoding command CMD_decBd in response to the second decoding command CMD_decB, the internal clock signal CLK_int and a control signal CTRL_s. For example, the output timing control circuit 130 may determine a predetermined cycle of the internal clock signal CLK_int in response to the control signal CTRL_s, delay the second decoding command CMD_decB by the predetermined period of the internal clock signal CLK_int that is determined, and output the delayed decoding command CMD_decBd. The control signal CTRL_s may be an output signal of an operation setting circuit of the semiconductor apparatus, such as a mode register set and a fuse circuit.

The first latch group 140 may include a first input/output control latch circuit 141 and a first input control latch circuit 142. [0028] The first input/output control latch circuit 141 may receive and latch the internal address ADD_int in response to the second decoding command CMD_decB and the delayed decoding command CMD_decBd, and output the latched internal address ADD_int as a first latch address ADD_LA. For example, the first input/output control latch circuit 141 may receive and latch the internal address ADD_int when the second decoding command CMD_decB is inputted, and output the latched internal address ADD_int as the first latch address ADD_LA when the delayed decoding command CMD_decBd is inputted.

The first input control latch circuit 142 may receive and latch the internal address ADD_int in response to the first decoding command CMD_decA, and output a second latch address ADD_LB. For example, the first input control latch circuit 142 may receive and latch the internal address ADD_int and output the second latch address ADD_LB, when the first decoding command CMD_decA is inputted.

The second semiconductor chip 200 may be stacked on the first semiconductor chip 100, and the first and second semiconductor chips 100 and 200 may be electrically coupled through a plurality of through electrodes TSV1, TSV2, TSV3 and TSV4. The plurality of through electrodes may include first to fourth through electrodes TSV1, TSV2, TSV3 and TSV4.

The first through electrode TSV1 may transfer the output signal of the third buffer 113 of the first semiconductor chip 100, that is, the internal address ADD_int, as an internal transfer address ADD_intT, to the second semiconductor chip 200.

The second through electrode TSV2 may transfer the output signal of the decoder 120 of the first semiconductor chip 100, that is, the first decoding command CMD_decA, as a first decoding transfer command CMD_decAT, to the second semiconductor chip 200.

The third through electrode TSV3 may transfer the output signal of the decoder 120 of the first semiconductor chip 100, that is, the second decoding command CMD_decB, as a second decoding transfer command CMD_decBT, to the second semiconductor chip 200.

The fourth through electrode TSV4 may transfer the output signal of the output timing control circuit 130 of the first semiconductor chip 100, that is, the delayed decoding command CMD_decBd, as a delayed decoding transfer command CMD_decBdT, to the second semiconductor chip 200.

The second semiconductor chip 200 may operate by receiving the internal address ADD_int, the first and second decoding commands CMD_decA and CMD_decB and the delayed decoding command CMD_decBd transferred from the first semiconductor chip 100 through the first to fourth through electrodes TSV1, TSV2, TSV3 and TSV4, as the internal transfer address ADD_intT, the first and second decoding transfer commands CMD_decAT and CMD_decBT and the delayed decoding transfer command CMD_decBdT.

The second semiconductor chip 200 may include a second latch group 210.

The second latch group 210 may include a second input/output control latch circuit 211 and a second input control latch circuit 212.

The second input/output control latch circuit 211 may operate in response to the internal transfer address ADD_intT, the second decoding transfer command CMD_decBT and the delayed decoding transfer command CMD_decBdT inputted through the first through electrode TSV1 and the third and fourth through electrodes TSV3 and TSV4. For example, the second input/output control latch circuit 211 may receive and latch the internal transfer address ADD_intT when the second decoding transfer command CMD_decBT is inputted, and output the latched internal transfer address ADD_intT as a third latch address ADD_LAA when the delayed decoding transfer command CMD_decBdT is inputted.

The second input control latch circuit 212 may operate in response to the internal transfer address ADD_intT and the first decoding transfer command CMD_decAT inputted through the first and second through electrodes TSV1 and TSV2. For example, the second input control latch circuit 212 may receive and latch the internal transfer address ADD_intT and output a fourth latch address ADD_LBB, when the first decoding transfer command CMD_decAT is inputted.

The output timing control circuit 130 may determine a predetermined cycle of the internal clock signal CLK_int in response to the control signal CTRL_s, delay the second decoding command CMD_decB by the predetermined period of the internal clock signal CLK_int that is determined, and output the delayed decoding command CMD_decBd.

Figure 2:
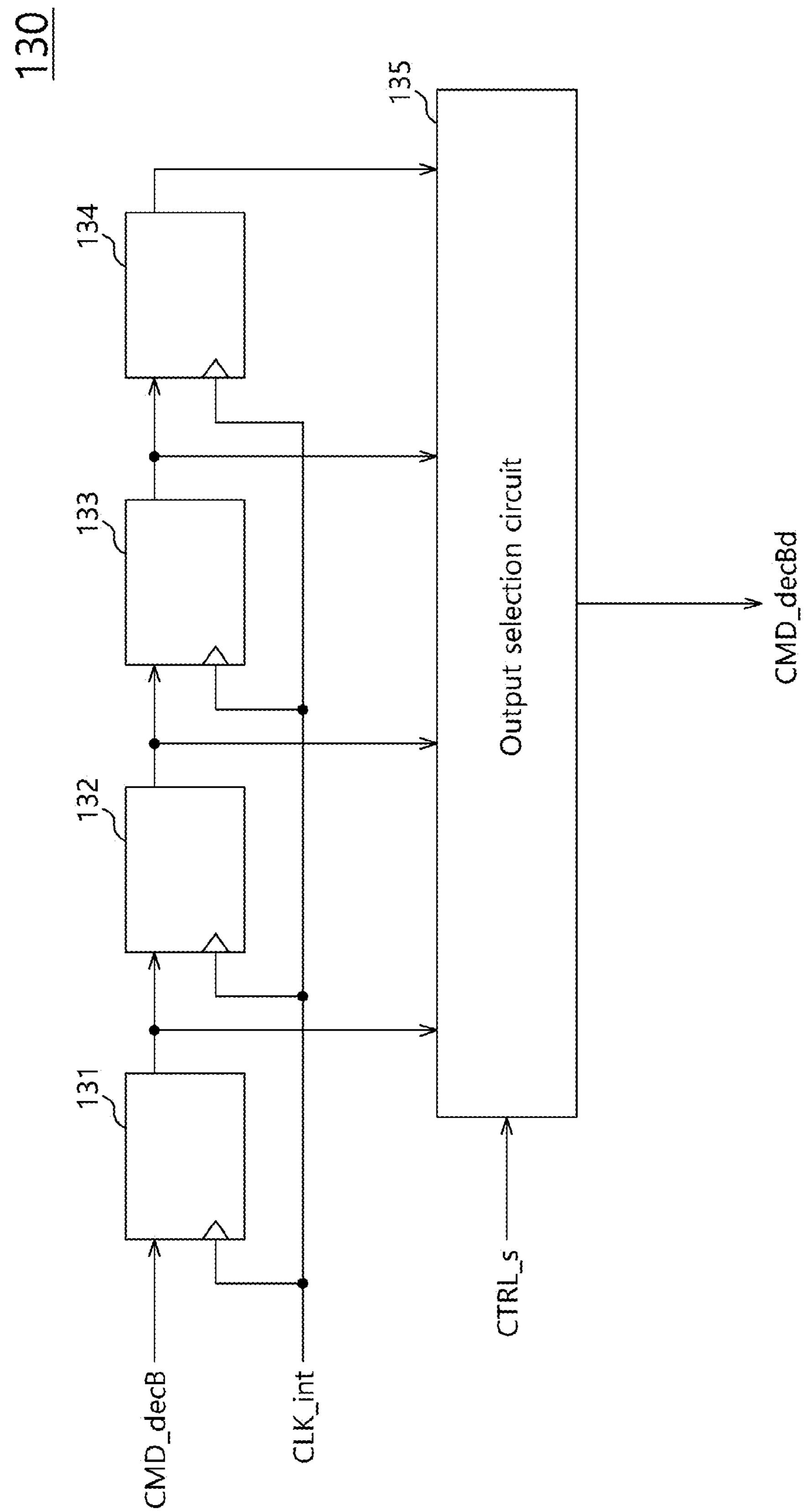
FIG. 2 is a configuration diagram illustrating a representation of an example of the output timing control circuit illustrated in FIG. 1.

Referring to FIG. 2, the output timing control circuit 130 may include first to fourth latches 131, 132, 133 and 134 and an output selection circuit 135. The first latch 131 receives the second decoding command CMD_decB and the internal clock signal CLK_int. The second latch 132 receives the output signal of the first latch 131 and the internal clock signal CLK_int. The third latch 133 receives the output signal of the second latch 132 and the internal clock signal CLK_int. The fourth latch 134 receives the output signal of the third latch 133 and the internal clock signal CLK_int. Each of the first to fourth latches 131, 132, 133 and 134 may receive and latch an input signal each time the internal clock signal CLK_int transitions to a predetermined level, and output the latched signal as an output signal. Each of the first to fourth latches 131, 132, 133 and 134 may be constructed by a flip-flop.

The output selection circuit 135 may output one among the output signals of the first to fourth latches 131, 132, 133 and 134, as the delayed decoding command CMD_decBd, in response to the control signal CTRL_s. The control signal CTRL_s may include at least one control signal.

The output timing control circuit 130 configured as mentioned above may operate as follows.

In the case where the output selection circuit 135 outputs the output signal of the first latch 131 as the delayed decoding command CMD_decBd in response to the control signal CTRL_s, the second decoding command CMD_decB may be delayed by one cycle of the internal clock signal CLK_int and be outputted as the delayed decoding command CMD_decBd.

In the case where the output selection circuit 135 outputs the output signal of the second latch 132 as the delayed decoding command CMD_decBd in response to the control signal CTRL_s, the second decoding command CMD_decB may be delayed by two cycles of the internal clock signal CLK_int and be outputted as the delayed decoding command CMD_decBd.

In the case where the output selection circuit 135 outputs the output signal of the third latch 133 as the delayed decoding command CMD_decBd in response to the control signal CTRL_s, the second decoding command CMD_decB may be delayed by three cycles of the internal clock signal CLK_int and be outputted as the delayed decoding command CMD_decBd.

In the case where the output selection circuit 135 outputs the output signal of the fourth latch 134 as the delayed decoding command CMD_decBd in response to the control signal CTRL_s, the second decoding command CMD_decB may be delayed by four cycles of the internal clock signal CLK_int and be outputted as the delayed decoding command CMD_decBd.

Figure 3:
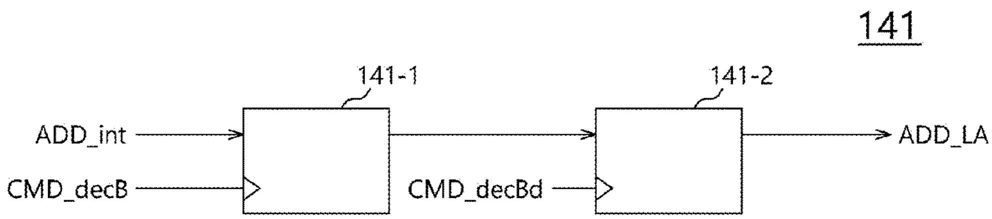
FIG. 3 is a configuration diagram illustrating a representation of an example of the first input and output (input/output) control latch circuit illustrated in FIG. 1.

Referring to FIG. 3, the first input/output control latch circuit 141 may include fifth and sixth latches 141-1 and 141-2.

The fifth latch 141-1 receives the internal address ADD_int and the second decoding command CMD_decB. The sixth latch 141-2 receives the output signal of the fifth latch 141-1 and the delayed decoding command CMD_decBd, and outputs the first latch address ADD_LA.

The fifth latch 141-1 configured as mentioned above receives, latches and outputs the internal address ADD_int when the second decoding command CMD_decB is inputted. The sixth latch 141-2 may output the latched output signal of the fifth latch 141-1 as the first latch address ADD_LA when the delayed decoding command CMD_decBd is inputted.

Therefore, the first input/output control latch circuit 141 may receive and latch the internal address ADD_int when the second decoding command CMD_decB is inputted, and output the latched signal as the first latch address ADD_LA when the delayed decoding command CMD_decBd is inputted.

The second input/output control latch circuit 211 may be configured in substantially the same way as the first input/output control latch circuit 141 except that the designations of the signals inputted thereto and outputted therefrom are different.

Thus, the second input/output control latch circuit 211 may receive and latch the internal transfer address ADD_intT when the second decoding transfer command CMD_decBT is inputted, and output the latched internal transfer address ADD_intT as the third latch address ADD_LAA when the delayed decoding transfer command CMD_decBdT is inputted.

Figure 4:
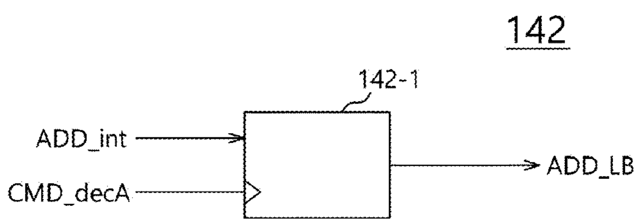
FIG. 4 is a configuration diagram illustrating a representation of an example of the first input control latch circuit illustrated in FIG. 1.

Referring to FIG. 4, the first input control latch circuit 142 may include a seventh latch 142-1.

The seventh latch 142-1 receives and latches the internal address ADD_int and the first decoding command CMD_decA, and outputs the latched signal as the second latch address ADD_LB. For example, the seventh latch 142-1 receives and latches the internal address ADD_int and outputs the latched signal as the second latch address ADD_LB, when the first decoding command CMD_decA is inputted.

Therefore, the first input control latch circuit 142 may receive and latch the internal address ADD_int and output the second latch address ADD_LB, when the first decoding command CMD_decA is inputted.

The second input control latch circuit 212 may be configured in substantially the same way as the first input control latch circuit 142 except that the designations of the signals inputted thereto and outputted therefrom are different.

Thus, the second input control latch circuit 212 may receive and latch the internal transfer address ADD_intT and output the fourth latch address ADD_LBB, when the first decoding transfer command CMD_decAT is inputted.

The operation of the semiconductor apparatus in accordance with an embodiment, configured as mentioned above, will be described below.

The external clock signal CLK_ext, the external command CMD_ext and the external address ADD_ext are inputted to the first semiconductor chip 100 from the exterior. In an embodiment, the external clock signal CLK_ext, the external command CMD_ext and the external address ADD_ext may be generated from a device that is located outside or that is exteriorly located from the first semiconductor chip 100. The external clock signal CLK_ext, the external command CMD_ext and the external address ADD_ext may be received by the first semiconductor chip from a source located outside the first semiconductor chip 100.

The first to third buffers 111, 112 and 113 of the first semiconductor chip 100 buffer the external clock signal CLK_ext, the external command CMD_ext and the external address ADD_ext, and output the internal clock signal CLK_int, the internal command CMD_int and the internal address ADD_int.

The decoder 120 may decode the internal command CMD_int in synchronization with the internal clock signal CLK_int, and output a decoding result as the first decoding command CMD_decA and the second decoding command CMD_decB. The decoder 120 may output the first decoding command CMD_decA or the second decoding command CMD_decB, according to a result of decoding the internal command CMD_int.

The output timing control circuit 130 delays the second decoding command CMD_decB by the predetermined cycle of the internal clock signal CLK_int that is determined by the control signal CTRL_s, and outputs the delayed decoding command CMD_decBd.

The first input/output control latch circuit 141 receives and latches the internal address ADD_int when the second decoding command CMD_decB is inputted, and outputs the latched signal as the first latch address ADD_LA when the delayed decoding command CMD_decBd is inputted.

The first input control latch circuit 142 receives and latches the internal address ADD_int when the first decoding command CMD_decA is inputted, and outputs the latched signal as the second latch address ADD_LB.

In the case where the external command CMD_ext is a command which does not require output timing control, that is, in the case where a result of decoding the internal command CMD_int is outputted as the first decoding command CMD_decA, the first semiconductor chip 100 latches the internal address ADD_int in response to the first decoding command CMD_decA, and outputs the second latch address ADD_LB.

In the case where the external command CMD_ext is a command which requires output timing control, that is, in the case where a result of decoding the internal command CMD_int is outputted as the second decoding command CMD_decB, the first semiconductor chip 100 delays the second decoding command CMD_decB by the predetermined cycle of the internal clock signal CLK_int, and outputs the delayed decoding command CMD_decBd. The first semiconductor chip 100 latches the internal address ADD_int when the second decoding command CMD_decB is outputted, and outputs the latched signal as the first latch address ADD_LA when the delayed decoding command CMD_decBd is outputted.

The first semiconductor chip 100 may output a command inputted from an exterior by delaying it by a predetermined time or output the command without delaying it, depending on the command. An address inputted together with the command may be outputted by being delayed in the same way as the command or be outputted without being delayed.

The second semiconductor chip 200 receives the internal address ADD_int, the first and second decoding commands CMD_decA and CMD_decB and the delayed decoding command CMD_decBd from the first semiconductor chip 100 through the plurality of through electrodes, that is, the first to fourth through electrodes TSV1, TSV2, TSV3 and TSV4, as the internal transfer address ADD_intT, the first and second decoding transfer commands CMD_decAT and CMD_decBT and the delayed decoding transfer command CMD_decBdT.

The second input/output control latch circuit 211 receives and latches the internal transfer address ADD_intT when the second decoding transfer command CMD_decBT is inputted, and outputs the latched signal as the third latch address ADD_LAA when the delayed decoding transfer command CMD_decBdT is inputted.

The second input control latch circuit 212 receives and latches the internal transfer address ADD_intT when the first decoding transfer command CMD_decAT is inputted, and outputs the latched signal as the fourth latch address ADD_LBB.

In the case where the external command CMD_ext is a command which does not require output timing control, that is, in the case where a result of decoding the internal command CMD_int is outputted as the first decoding command CMD_decA and is inputted from the first semiconductor chip 100, the second semiconductor chip 200 latches the internal transfer address ADD_intT in response to the first decoding transfer command CMD_decAT, and outputs the fourth latch address ADD_LBB.

In the case where the external command CMD_ext is a command which requires output timing control, that is, in the case where a result of decoding the internal command CMD_int is outputted as the second decoding command CMD_decB and is inputted as the second decoding transfer command CMD_decBT from the first semiconductor chip 100, the second semiconductor chip 200 receives the delayed decoding command CMD_decBd generated by delaying the second decoding command CMD_decB by the predetermined cycle of the internal clock signal CLK_int, as the delayed decoding transfer command CMD_decBdT. The second semiconductor chip 200 latches the internal transfer address ADD_intT when the second decoding transfer command CMD_decBT is inputted, and outputs the latched signal as the third latch address ADD_LAA when the delayed decoding transfer command CMD_decBdT is inputted.

In the same manner as the first semiconductor chip 100, the second semiconductor chip 200 may output a command inputted from an exterior by delaying it by a predetermined time or output the command without delaying it, depending on the command. An address inputted together with the command may be outputted by being delayed in the same way as the command or be outputted without being delayed. Since the second semiconductor chip 200 may not include the buffers 111, 112 and 113, the decoder 120 and the output timing control circuit 130 which are included in the first semiconductor chip 100, area efficiency may be improved. Also, it may not be necessary to form a through electrode for transferring the internal clock signal CLK_int from the first semiconductor chip 100 to the second semiconductor chip 200, and current to be consumed to transfer the internal clock signal CLK_int which transitions cyclically, from the first semiconductor chip 100 to the second semiconductor chip 200, may be saved.

Figure 5:
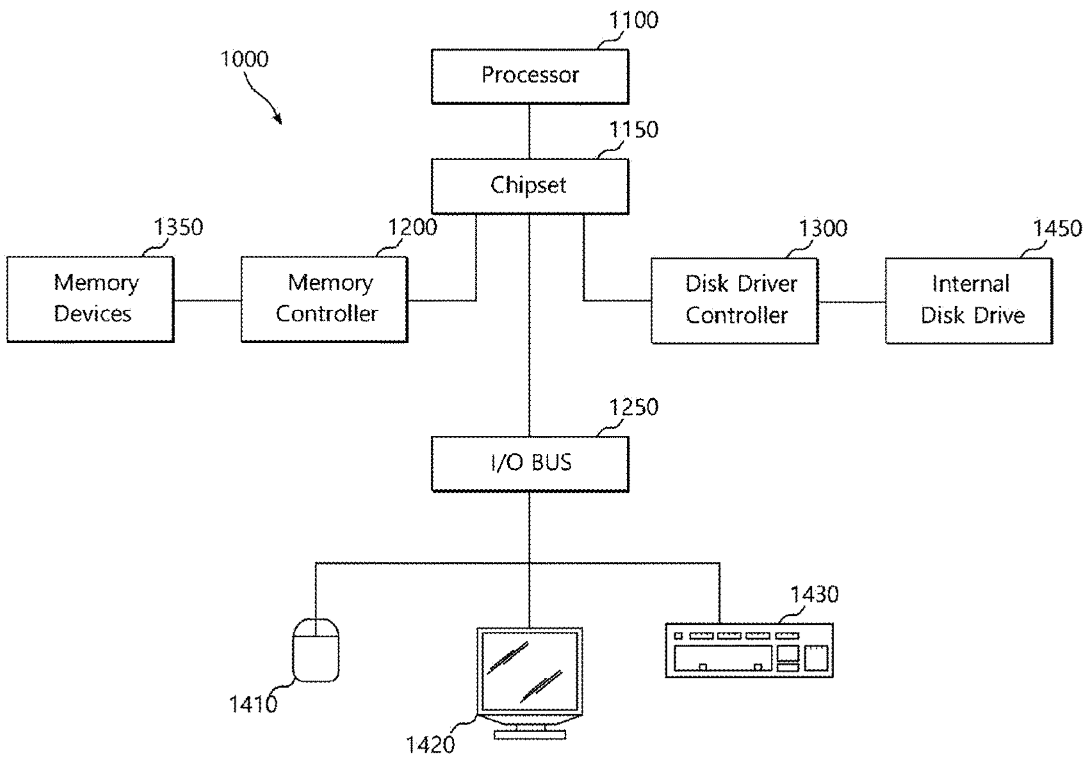
FIG. 5 illustrates a block diagram of an example of a representation of a system employing a semiconductor apparatus and or semiconductor integrated circuit with the various embodiments discussed above with relation to FIGS. 1-4.

The semiconductor apparatuses and or semiconductor integrated circuits as discussed above (see FIGS. 1-4) are particular useful in the design of other memory devices, processors, and computer systems. For example, referring to FIG. 5, a block diagram of a system employing a semiconductor apparatus and or semiconductor integrated circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus and or semiconductor integrated circuit as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus and or semiconductor integrated circuit as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a semiconductor apparatus and or semiconductor integrated circuit as discussed above with relation to FIGS. 1-4. In alternate embodiments, such as, for example but not limited to, cellular phones or digital cameras, the components may differ from the embodiments illustrated in FIG. 5.

While various embodiments have been described above, it will be understood to those skilled in the art that the embodiments described are examples only. Accordingly, the semiconductor apparatuses described herein should not be limited based on the described embodiments.

What is claimed is:

1. A semiconductor apparatus comprising:

a first semiconductor chip including a buffer group, a decoder, an output timing control circuit and a first latch group coupled to one another and configured to generate signals; and a second semiconductor chip including a second latch group which operates based on the signals inputted from the first semiconductor chip.

2. The semiconductor apparatus according to claim 1, wherein the first semiconductor chip and the second semiconductor chip are electrically coupled with each other through a plurality of through electrodes.

3. The semiconductor apparatus according to claim 1, wherein the buffer group comprises:

a first buffer configured to buffer an external clock and output an internal clock;

a second buffer configured to buffer an external command and output an internal command; and a third buffer configured to buffer an external address and output an internal address.

4. The semiconductor apparatus according to claim 3, wherein the decoder decodes the internal command in synchronization with the internal clock, and generates a first decoding command and a second decoding command.

5. The semiconductor apparatus according to claim 4, wherein the output timing control circuit delays the second decoding command by a predetermined cycle of the internal clock, and outputs a delayed decoding command.

6. The semiconductor apparatus according to claim 5, wherein the first latch group comprises:

a first input and output (input/output) control latch circuit configured to latch the internal address based on the second decoding command, and output the latched internal address as a first latch address based on the delayed decoding command; and a first input control latch circuit configured to latch the internal address based on the first decoding command, and output the latched internal address as a second latch address.

7. The semiconductor apparatus according to claim 6, wherein the second latch group receives the internal address, the first decoding command, the second decoding command and the delayed decoding command inputted from the first semiconductor chip, as an internal transfer address, a first decoding transfer command, a second decoding transfer command and a delayed decoding transfer command, respectively, and wherein the second latch group comprises:

a second input/output control latch circuit configured to latch the internal transfer address based on the second decoding transfer command, and output the latched internal transfer address as a third latch address based on the delayed decoding transfer command; and a second input control latch circuit configured to latch the internal transfer address based on the first decoding transfer command, and output the latched internal transfer address as a fourth latch address.

* * * * *